US012702014B2

(12) United States Patent
Aikawa et al.

(10) Patent No.: US 12,702,014 B2
(45) Date of Patent: Aug. 4, 2026

(54) HIGH-FREQUENCY MODULE

(71) Applicant: Murata Manufacturing Co., Ltd.,
Nagaokakyo (JP)

(72) Inventors: Kiyoshi Aikawa, Nagaokakyo (JP);
Hiromichi Kitajima, Nagaokakyo (JP);
Takanori Uejima, Nagaokakyo (JP);
Takashi Yamada, Nagaokakyo (JP);
Yoshihiro Daimon, Nagaokakyo (JP)

(73) Assignee: **MURATA MANUFACTURING CO.,
LTD.**, Nagaokakyo (JP)

( * ) Notice: Subject to any disclaimer, the term of this
patent is extended or adjusted under 35
U.S.C. 154(b) by 407 days.

(21) Appl. No.: 18/475,231

(22) Filed: Sep. 27, 2023

(65) Prior Publication Data

US 2024/0030165 A1     Jan. 25, 2024

Related U.S. Application Data

(63) Continuation of application No.
PCT/JP2022/010870, filed on Mar. 11, 2022.

(30) Foreign Application Priority Data

Mar. 31, 2021    (JP) ................................. 2021-060375

(51) Int. Cl.
H01L 23/66        (2006.01)
H03F 3/213        (2006.01)
(Continued)
(52) U.S. Cl.
CPC ............ H10W 44/20 (2026.01); H03F 3/213
(2013.01); H10W 42/20 (2026.01); **H10W
70/65** (2026.01);
(Continued)

(58) Field of Classification Search
CPC ............... H01L 23/66; H01L 23/49822; H01L
23/49838; H01L 23/552
(Continued)

(56) References Cited

U.S. PATENT DOCUMENTS

2009/0128254 A1*  5/2009  Goi ...................... H04B 1/0067
                                                                     333/101
2015/0119102 A1*  4/2015  Saji ...................... H04B 1/3888
                                                                     455/550.1
(Continued)

FOREIGN PATENT DOCUMENTS

CN        111355513 A       6/2020
JP        2020-120185 A     8/2020
(Continued)

OTHER PUBLICATIONS

International Search Report and Written Opinion mailed on May 24,
2022, received for PCT Application PCT/JP2022/010870, filed on
Mar. 11, 2022, 8 pages including English Translation.
(Continued)

*Primary Examiner* — Binh B Tran
(74) *Attorney, Agent, or Firm* — XSENSUS LLP

(57)         ABSTRACT

A high-frequency module includes a module substrate
including major surfaces opposite to each other; a module
substrate including major surfaces opposite to each other,
the major surface being disposed facing the major surface;
a first electronic component including a filter coupled to a
power amplifier; a second electronic component including a
filter coupled to a low-noise amplifier; and a third electronic
component (an integrated circuit) including the low-noise
amplifier. The first electronic component is disposed one of
between the major surfaces, on the major surface, and on the
major surface. The second electronic component is disposed
another one of between the major surface surfaces, on the
major surface, and on the major surface. The third electronic
(Continued)

component is disposed other one of between the major surfaces, on the major surface, and on the major surface.

19 Claims, 5 Drawing Sheets

(51) Int. Cl.

| | |
|---|---|
| *H10W 42/20* | (2026.01) |
| *H10W 44/20* | (2026.01) |
| *H10W 70/65* | (2026.01) |
| *H10W 70/685* | (2026.01) |
| *H10W 90/00* | (2026.01) |

(52) U.S. Cl.
CPC ......... *H10W 70/685* (2026.01); *H10W 90/00* (2026.01); *H03F 2200/294* (2013.01); *H10W 44/234* (2026.01); *H10W 44/241* (2026.01); *H10W 90/723* (2026.01); *H10W 90/725* (2026.01)

(58) Field of Classification Search
USPC .......................................................... 361/761
See application file for complete search history.

(56) References Cited

U.S. PATENT DOCUMENTS

| | | | |
|---|---|---|---|
| 2016/0006408 A1* | 1/2016 | Murata | ................. H04B 1/0057 |
| | | | 343/852 |
| 2018/0167094 A1* | 6/2018 | Aramata | ................... H04B 1/52 |
| 2019/0267339 A1* | 8/2019 | Murase | ................... H01L 23/66 |
| 2020/0051942 A1* | 2/2020 | Nakazawa | ............. H01L 24/16 |

FOREIGN PATENT DOCUMENTS

| | | | |
|---|---|---|---|
| WO | 2019/240097 A1 | 12/2019 |
| WO | 2020/022180 A1 | 1/2020 |
| WO | 2020/261819 A1 | 12/2020 |

OTHER PUBLICATIONS

Office Action issued on Jun. 12, 2026, in corresponding Chinese patent Application No. 202280025077.7, 8 pages.

\* cited by examiner

HIGH-FREQUENCY MODULE

CROSS-REFERENCE TO RELATED APPLICATIONS

This application is a continuation application of PCT International Application No. PCT/JP2022/010870 filed on Mar. 11, 2022, designating the United States of America, which is based on and claims priority of Japanese Patent Application No. 2021-060375 filed on Mar. 31, 2021. The entire disclosures of the above-identified applications, including the specifications, drawings and claims are incorporated herein by reference in their entirety.

TECHNICAL FIELD

The present disclosure relates to a high-frequency module.

BACKGROUND

In mobile communication devices, such as cellular phones, high-frequency front-end modules are becoming more and more complicated with an increasing number of bands to be supported in particular. Patent Document 1 discloses a technique to reduce the size of a high-frequency module by using two module substrates.

CITATION LIST

Patent Document

Patent Document 1: International Publication No. WO 2020/022180

SUMMARY

Technical Problems

However, as recognized by the present inventor, according to the aforementioned technique in the related art, the reduction in size can result in poor isolation between plural electronic components.

The present disclosure addresses the above-identified and other problems, and is to provide a high-frequency module that can be reduced in size and can be inhibited from having poor isolation between plural electronic components.

Solutions

A high-frequency module according to an aspect of the present disclosure includes: a first module substrate including a first major surface and a second major surface that are opposite to each other; a second module substrate including a third major surface and a fourth major surface that are opposite to each other, the third major surface being disposed facing the second major surface; a plurality of electronic components disposed between the second major surface and the third major surface, on the first major surface, and on the fourth major surface; and a plurality of external connection terminals disposed on the fourth major surface. The plurality of electronic components include: a first electronic component including a first filter coupled to a power amplifier; a second electronic component including a second filter coupled to a low-noise amplifier; and a third electronic component including the low-noise amplifier. The first electronic component is disposed one of between the second major surface and the third major surface, on the first major surface, and on the fourth major surface. The second electronic component is disposed another one of between the second major surface and the third major surface, on the first major surface, and on the fourth major surface. The third electronic component is disposed other one of between the second major surface and the third major surface, on the first major surface, and on the fourth major surface.

A high-frequency module according to an aspect of the present disclosure includes: a module substrate including a first major surface and a second major surface that are opposite to each other; a plurality of electronic components disposed on the first major surface, on the second major surface, and within the module substrate; and a plurality of external connection terminals disposed on the second major surface. The plurality of electronic components include: a first electronic component including a first filter coupled to a power amplifier; a second electronic component including a second filter coupled to a low-noise amplifier; and a third electronic component including the low-noise amplifier. The first electronic component is disposed one of on the first major surface, on the second major surface, and within the module substrate. The second electronic component is disposed another one of on the first major surface, on the second major surface, and within the module substrate. The third electronic component is disposed other one of on the first major surface, on the second major surface, and within the module substrate.

Advantageous Effects

The high-frequency module according to an aspect of the present disclosure can be reduced in size and can be inhibited from having poor isolation between plural electronic components.

DETAILED DESCRIPTION

Figure 1:
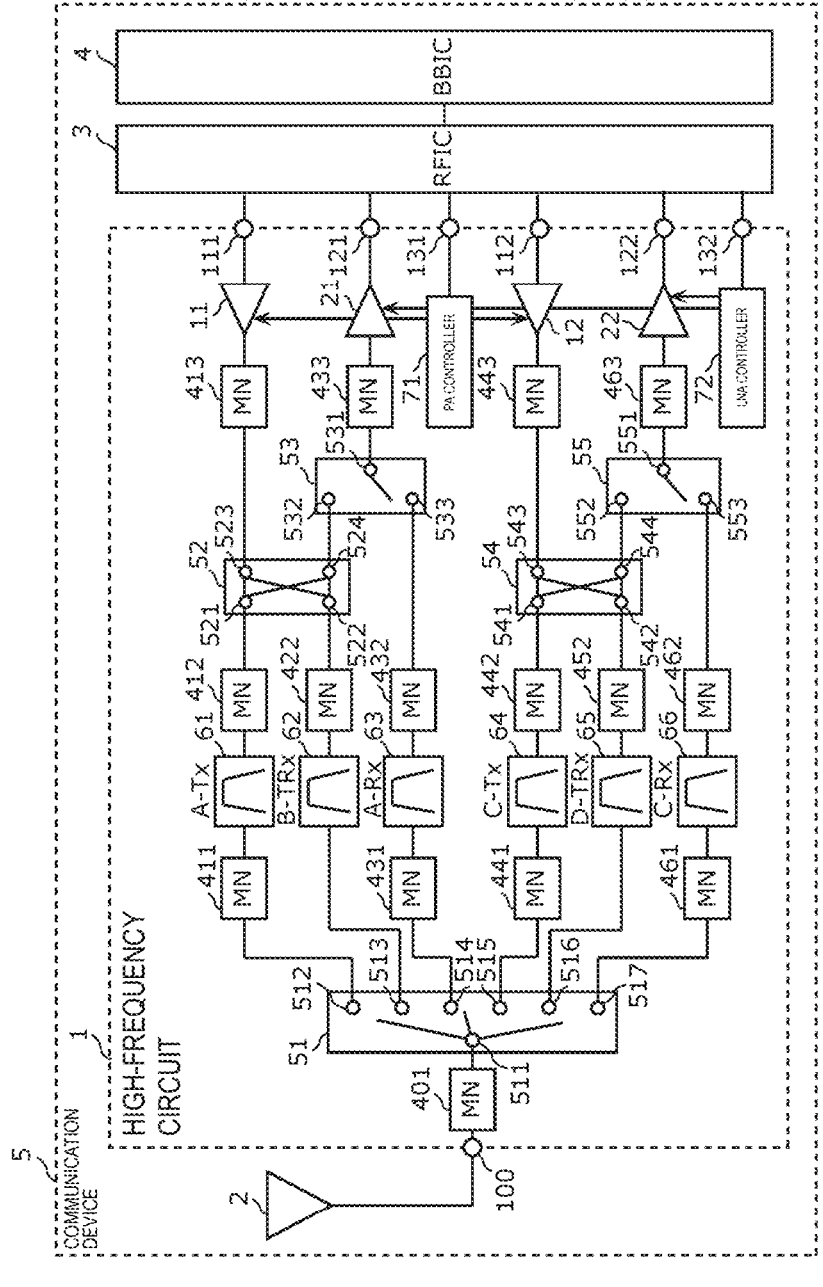
FIG. 1 is a circuit diagram of a high-frequency circuit and a communication device according to an embodiment.

Hereinafter, the present disclosure is described in detail using the drawings. The embodiments described below illustrate a comprehensive or specific example. The numerical values, shapes, materials, constituent components, arrangements, and connections of the constituent components, and the like described in the following embodiments are illustrative only and will not limit the present disclosure.

Each drawing is a schematic diagram including proper emphases, omissions, or adjustment of proportions in order to show the present disclosure and is not always illustrated exactly. The shapes, positional relationships, and proportions in each drawing are sometimes different from actual ones. In the drawings, substantially identical configurations are denoted by the same reference numerals, and redundant description may be omitted or simplified.

In each drawing below, x- and y-axes are orthogonal to each other on a plane parallel to the major surfaces of a module substrate. Specifically, when the module substrate is rectangular in a planar view, the x-axis is parallel to a first side of the module substrate, and the y-axis is parallel to a second side of the module substrate that is orthogonal to the first side. z-axis is vertical to the major surfaces of the module substrate, and the positive z-axis direction thereof is an upward direct while the negative z-axis direction is a downward direction.

In the circuit configuration of the present disclosure, "to be coupled" includes not only to be directly coupled with a connection terminal and/or a trace conductor but also to be electrically coupled via another circuit element. "To be coupled between A and B" indicates to be coupled to both A and B between A and B and includes, in addition to be coupled in series to a path connecting A and B, to be coupled in parallel between the path and ground (shunt connection).

In a component arrangement of the present disclosure, a "planar view" refers to a view of an object orthogonally projected onto an x-y plane as seen in the negative z-axis direction. "A overlaps B in a planar view" means that the region of A orthogonally projected onto the x-y plane overlaps the region of B orthogonally projected onto the x-y plane. "A is disposed between B and C" means that at least one of plural line segments connecting any point within B and any point within C passes through A. "A is joined to B" means that A is physically coupled to B. Terms indicating relationships between elements, such as "parallel" or "vertical", terms indicating element shapes, such as "rectangular", and numerical ranges express not only their exact meaning but also substantially equivalent ranges, for example, including several percent errors.

In component arrangements of the present disclosure, "a component is disposed in a substrate" includes the component being disposed on a major surface of the substrate and the component being disposed within the substrate. "A component is disposed on a major surface of a substrate" includes not only the component being disposed in contact with a major surface of the substrate but also the component being disposed on a major surface side without being in contact with the major surface (for example, the component is stacked atop another component disposed in contact with the major surface). In addition, "a component is disposed on a major surface of a substrate" may include the component being within a recess formed in the major surface. "A component is disposed within a substrate" means that the component is encapsulated within the module substrate and does not include either of the component being fully disposed between the major surfaces of the substrate but being partially exposed from the substrate or the component being partially disposed within the substrate. "A component is disposed between two major surfaces" includes not only the component being disposed in contact with both the two major surfaces but also the component being disposed in contact with only one of the two major surfaces or disposed without being in contact with either of the two major surfaces.

EMBODIMENT

[1 Circuit Configuration of High-Frequency Circuit 1 and Communication Device 5]

The circuit configurations of a high-frequency circuit 1 and a communication device 5 according to an embodiment are described with reference to FIG. 1. FIG. 1 is a circuit diagram of the high-frequency circuit 1 and communication device 5 according to the embodiment.

[1.1 Circuit configuration of Communication Device 5]

First, the circuit configuration of the communication device 5 is described. As illustrated in FIG. 1, the communication device 5 according to the embodiment includes the high-frequency circuit 1, an antenna 2, a radio frequency integrated circuit (RFIC) 3, and a baseband integrated circuit (BBIC) 4.

The high-frequency circuit 1 transfers high frequency signals between the antenna 2 and the RFIC 3. The internal configuration of the high-frequency circuit 1 is described later.

The antenna 2 is coupled to an antenna connection terminal 100 of the high-frequency circuit 1. The antenna 2 transmits a high-frequency signal outputted from the high-frequency circuit 1. The antenna 2 receives a high-frequency signal from the outside and outputs the received high-frequency signal to the high-frequency circuit 1.

The RFIC 3 is an example of a signal processing circuit to process high-frequency signals. Specifically, the RFIC 3 performs signal processing, such as down-conversion, for a high-frequency reception signal inputted through a reception path of the high-frequency circuit 1 and outputs to the BBIC 4, the reception signal generated through the signal processing. The RFIC 3 performs signal processing, such as up-conversion, for a transmission signal inputted from the BBIC 4 and outputs a high-frequency transmission signal generated by the signal processing to a transmission path of the high-frequency circuit 1. The RFIC 3 includes a controller to control switches, amplifiers, and other elements included in the high-frequency circuit 1. Part of or all of the functions of the RFIC 3 as a controller may be implemented outside the RFIC 3 and, for example, may be implemented in the BBIC 4 or the high-frequency circuit 1.

The BBIC 4 is a baseband signal processing circuit that performs signal processing using an intermediate frequency band lower than frequencies of high-frequency signals transferred by the high-frequency circuit 1. Examples of the signals to be processed by the BBIC 4 are image signals for image display and/or audio signals for voice calls using a speaker.

In the communication device 5 according to the embodiment, the antenna 2 and BBIC 4 are not essential constituent elements.

[1.2 Circuit Configuration of High-frequency Circuit 1]

Next, the circuit configuration of the high-frequency circuit 1 is described. As illustrated in FIG. 1, the high-frequency circuit 1 includes power amplifiers (PAs) 11 and 12, low-noise amplifiers (LNAs) 21 and 22, matching networks (MN) 401, 411 to 413, 422, 431 to 433, 441 to 443, 452, and 461 to 463, switches (SWs) 51 to 55, filters 61 to 66, a PA controller (PAC) 71, an LNA controller (LNAC) 72, the antenna connection terminal 100, high-frequency input terminals 111 and 112, high-frequency output terminals 121 and 122, and control terminals 131 and 132. Hereinafter, the constituent elements of the high-frequency circuit 1 are described sequentially.

The antenna connection terminal 100 is coupled to the antenna 2 outside the high-frequency circuit 1.

Each of the high-frequency input terminals 111 and 112 is a terminal to receive high-frequency transmission signals from the outside of the high-frequency circuit 1. In the embodiment, the high-frequency input terminals 111 and 112 are coupled to the RFIC 3 outside the high-frequency circuit 1.

Each of the high-frequency output terminals 121 and 122 is a terminal to supply high-frequency reception signals to the outside of the high-frequency circuit 1. In the embodiment, the high-frequency output terminals 121 and 122 are coupled to the RFIC 3 outside the high-frequency circuit 1.

The control terminals 131 and 132 are terminals to transfer control signals. Specifically, the control terminals 131 and 132 are terminals to receive control signals from the outside of the high-frequency circuit 1 and/or terminals to supply control signals to the outside of the high-frequency circuit 1. The control signals are signals concerning control of electronic circuits included in the high-frequency circuit 1. Specifically, the control signals are digital signals to control at least one of the power amplifiers 11 and 12, low-noise amplifiers 21 and 22, and switches 51 to 55, for example. The high-frequency circuit 1 is able to receive digital signals to control the power amplifiers 11 and 12 from the RFIC 3 via the control terminal 131. The high-frequency circuit 1 is also able to receive digital signals to control the low-noise amplifiers 21 and 22 from the RFIC 3 via the control terminal 132.

The power amplifier 11 is coupled between the high-frequency input terminal 111 and the filters 61 and 62 and is able to amplify transmission signals in bands A and B. Specifically, the input end of the power amplifier 11 is coupled to the high-frequency input terminal 111. The output end of the power amplifier 11 is coupled to the filter 61 via the matching network 413, switch 52, and matching network 412. The output end of the power amplifier 11 is also coupled to the filter 62 via the matching network 413, switch 52, and matching network 422.

The power amplifier 12 is coupled between the high-frequency input terminal 112 and the filters 64 and 65 and is able to amplify transmission signals in bands C and D. Specifically, the input end of the power amplifier 12 is coupled to the high-frequency input terminal 112. The output end of the power amplifier 12 is coupled to the filter 64 via the matching network 443, switch 54, and matching network 442. The output end of the power amplifier 12 is also coupled to the filter 65 via the matching network 443, switch 54, and matching network 452.

The power amplifiers 11 and 12 are electronic components that provide an output signal having a larger energy than an input signal (a transmission signal) based on power supplied from a power supply. Each of the power amplifiers 11 and 12 includes an amplification transistor and may further include an inductor and/or a capacitor. The internal configuration of the power amplifiers 11 and 12 are not limited. For example, each of the power amplifiers 11 and 12 may be a multistage amplifier, a differential amplifier, or a Doherty amplifier.

The power amplifier 11 may support a first power class that allows a maximum output power of higher than that of a second power class. In this case, the power amplifier 11 is able to amplify a transmission signal to a power that meets the maximum output power allowed by the first power class. The power amplifier 12 may support the second power class that allows a maximum output power of lower than that of the first power class. In this case, the power amplifier 12 is able to amplify a transmission signal to a power that meets the maximum output power allowed by the second power class.

The power classes are classifications of the output power of a terminal defined by the maximum output power or the like. A smaller power class number indicates that the terminal covers a higher output power. For example, in 3GPP, the maximum output power of power class 1 is 31 dBm; power class 1.5, 29 dBm; power class 2, 26 dBm; and power class 3, 23 dBm.

The maximum output power of a terminal is defined by output power at an antenna end of the terminal. The maximum output power of the terminal is measured by a method defined by 3GPP or the like, for example. In FIG. 1, for example, the measurement of the maximum output power is carried out by measuring radiated power at the antenna 2. Instead of measuring the radiated power, the output power of the antenna 2 can be measured by providing a terminal near the antenna 2 and connecting measurement equipment (a spectrum analyzer, for example) to the terminal.

The power class supported by a power amplifier can be specified by the maximum output power of the power amplifier. For example, the maximum output power of a power amplifier supporting power class 1 is greater than 31 dBm. Generally, the maximum output power of a power amplifier depends on the size and semiconductor material of the semiconductor device constituting the power amplifier. For example, the size of a semiconductor device increases with the maximum output power thereof. In some cases, therefore, comparing the sizes of semiconductor devices of two power amplifiers composed of the same semiconductor material provides a relative comparison between power classes supported by the two power amplifiers. For example, some semiconductor devices constituting power amplifiers of high maximum output power are made of a special semiconductor material for high power (for example, gallium nitride (GaN), silicon carbide (SiC), or the like). In some case, therefore, comparing the semiconductor materials used in two semiconductor devices provides a relative comparison between power classes supported by the two power amplifiers.

The low-noise amplifier 21 is coupled between the filter 62 and 63 and the high-frequency output terminal 121 and is able to amplify reception signals in the bands A and B. Specifically, the input end of the low-noise amplifier 21 is coupled to the filter 62 via the matching network 433, switches 53 and 52, and matching network 422. The input end of the low-noise amplifier 21 is also coupled to the filter 63 via the matching network 433, switch 53, and matching network 432. The output end of the low-noise amplifier 21 is coupled to the high-frequency output terminal 121.

The low-noise amplifier 22 is coupled between the filters 65 and 66 and the high-frequency output terminal 122 and is able to amplify reception signals in the bands C and D. Specifically, the input end of the low-noise amplifier 22 is coupled to the filter 65 via the matching network 463, switches 55 and 54, and matching network 452. The input end of the low-noise amplifier 22 is also coupled to the filter 66 via the matching network 463, switch 55, and matching network 462. The output end of the low-noise amplifier 22 is coupled to the high-frequency output terminal 122.

The low-noise amplifiers 21 and 22 are electronic components that provide an output signal having a larger energy than that of an input signal (a reception signal) based on power supplied from the power supply. Each of the low-noise amplifiers 21 and 22 includes an amplification transistor and may further include an inductor and/or a capacitor. The internal configurations of the low-noise amplifiers 21 and 22 are not limited.

Each of the matching networks 401, 411 to 413, 422, 431 to 433, 441 to 443, 452, and 461 to 463 is coupled between two circuit elements and is able to provide impedance matching between the two circuit elements. Thus, each of the matching networks 401, 411 to 413, 422, 431 to 433, 441 to 443, 452, and 461 to 463 is an impedance matching network. Each of the matching networks 401, 411 to 413, 422, 431 to 433, 441 to 443, 452, and 461 to 463 includes an inductor and may further include a capacitor.

The switch 51 is coupled between the antenna connection terminal 100 and the filters 61 to 66. The switch 51 includes terminals 511 to 517. The terminal 511 is coupled to the antenna connection terminal 100. The terminal 512 is coupled to the filter 61 via the matching network 411. The terminal 513 is coupled to the filter 62. The terminal 514 is coupled to the filter 63 via the matching network 431. The terminal 515 is coupled to the filter 64 via the matching network 441. The terminal 516 is coupled to the filter 65. The terminal 517 is coupled to the filter 66 via the matching network 461.

In this connection configuration, the switch 51 is able to connect the terminal 511 to at least one of the terminals 512 to 517 based on a control signal from the RFIC 3, for example. The switch 51 is able to switch whether to couple the antenna connection terminal 100 to each of the filters 61 to 66. The switch 51 is composed of a multi-connection switch circuit, for example, and is sometimes referred to as an antenna switch.

The switch 52 is coupled between the output end of the power amplifier 11 and the filters 61 and 62 and is coupled between the input end of the low-noise amplifier 21 and the filter 62. The switch 52 includes terminals 521 to 524. The terminal 521 is coupled to the filter 61 via the matching network 412. The terminal 522 is coupled to the filter 62 via the matching network 422. The terminal 523 is coupled to the output end of the power amplifier 11 via the matching network 413. The terminal 524 is coupled to the input end of the low-noise amplifier 21 via the switch 53 and matching network 433.

In this connection configuration, the switch 52 is able to couple the terminal 523 to at least one of the terminals 521 and 522 and couple the terminal 522 to at least one of the terminals 523 and 524 based on a control signal from the RFIC 3, for example. The switch 52 is able to switch whether to couple the power amplifier 11 to each of the filters 61 and 62 and is able to switch connections between the filter 62 and the power amplifier 11 and between the filter 62 and the low-noise amplifier 21. The switch 52 is composed of a multi-connection switch circuit, for example.

The switch 53 is coupled between the input end of the low-noise amplifier 21 and the filters 62 and 63. The switch 53 includes terminals 531 to 533. The terminal 531 is coupled to the input end of the low-noise amplifier 21 via the matching network 433. The terminal 532 is coupled to the terminal 524 of the switch 52 and is coupled to the filter 62 via the switch 52 and matching network 422. The terminal 533 is coupled to the filter 63 via the matching network 432.

In this connection configuration, the switch 53 is able to couple the terminal 531 to at least one of the terminals 532 and 533 based on a control signal from the RFIC 3, for example. The switch 53 is thus able to switch whether to couple the low-noise amplifier 21 to each of the filters 62 and 63. The switch 53 is composed of a multi-connection switch circuit, for example.

The switch 54 is coupled between the output end of the power amplifier 12 and the filters 64 and 65 and is coupled between the input end of the low-noise amplifier 22 and the filter 65. The switch 54 includes terminals 541 to 544. The terminal 541 is coupled to the filter 64 via the matching network 442. The terminal 542 is coupled to the filter 65 via the matching network 452. The terminal 543 is coupled to the output end of the power amplifier 12 via the matching network 443. The terminal 544 is coupled to the input end of the low-noise amplifier 22 via the switch 55 and matching network 463.

In this connection configuration, the switch 54 is able to couple the terminal 543 to at least one of the terminals 541 and 542 and couple the terminal 542 to either the terminal 543 or 544 based on a control signal from the RFIC 3, for example. The switch 54 is thus able to switch whether to couple the power amplifier 12 to each of the filters 64 and 65 and switch connections between the filter and the power amplifier 12 and between the filter 65 and the low-noise amplifiers 22. The switch 54 is composed of a multi-connection switch circuit, for example.

The switch 55 is coupled between the input end of the low-noise amplifier 22 and the filters 65 and 66. The switch 55 includes terminals 551 to 553. The terminal 551 is coupled to the input end of the low-noise amplifier 22 via the matching network 463. The terminal 552 is coupled to the terminal 544 of the switch 54 and is coupled to the filter 65 via the switch 54 and matching network 452. The terminal 553 is coupled to the filter 66 via the matching network 462.

In this connection configuration, the switch 55 is able to couple the terminal 551 to at least one of the terminals 552 and 553 based on a control signal from the RFIC 3, for example. The switch 55 is thus able to switch whether to couple the low-noise amplifier 22 to each of the filters 65 and 66. The switch 55 is composed of a multi-connection switch circuit, for example.

The switch 61 (A-Tx) is an example of a first filter. The filter 61 (A-Tx) is coupled between the power amplifier 11 and the antenna connection terminal 100. Specifically, an end of the filter 61 is coupled to the antenna connection terminal 100 via the matching network 411, switch 51, and matching network 401. The other end of the filter 61 is coupled to the output end of the power amplifier 11 via the matching network 412, switch 52, and matching network 413. The filter 61 has a pass band including an uplink operation band of the band A for frequency division duplex (FDD) and is able to pass transmission signals in the band A.

The filter 62 (B-TRx) is an example of a third filter. The filter 62 is coupled between the antenna connection terminal 100 and the power amplifier 11 and is coupled between the antenna connection terminal 100 and the low-noise amplifier 21. Specifically, an end of the filter 62 is coupled to the antenna connection terminal 100 via the switch 51 and matching network 401. The other end of the filter 62 is coupled to the output end of the power amplifier 11 via the matching network 422, switch 52, and matching network 413 and is coupled to the input end of the low-noise amplifier 21 via the matching network 422, switches 52 and 53, and matching network 433. The filter 62 has a pass band including the band B for time division duplex (TDD) and is able to pass transmission and reception signals in the band B.

The filter 63 (A-Rx) is an example of a second filter and is coupled between the low-noise amplifier 21 and the antenna connection terminal 100. Specifically, an end of the filter 63 is coupled to the antenna connection terminal 100 via the matching network 431, switch 51, and matching network 401. The other end of the filter 63 is coupled to the input end of the low-noise amplifier 21 via the matching network 432, switch 53, and matching network 433. The filter 63 has a pass band including a downlink operation band of the band A for FDD and is able to pass reception signals in the band A.

The filter 64 (C-Tx) is coupled between the power amplifier 12 and the antenna connection terminal 100. Specifically, an end of the filter 64 is coupled to the antenna connection terminal 100 via the matching network 441, switch 51, and matching network 401. The other end of the filter 64 is coupled to the output end of the power amplifier 12 via the matching network 442, switch 54, and matching network 443. The filter 64 has a pass band including an uplink operation band of the band C for FDD and is able to pass transmission signals in the band C.

The filter 65 (D-TRx) is coupled between the antenna connection terminal 100 and the power amplifier 12 and is coupled between the antenna connection terminal 100 and the low-noise amplifier 22. Specifically, an end of the filter 65 is coupled to the antenna connection terminal 100 via the switch 51 and matching network 401. The other end of the filter 65 is coupled to the output end of the power amplifier 12 via the matching network 452, switch 54, and matching network 443 and is coupled to the input end of the low-noise amplifier 22 via the matching network 452, switches 54 and 55, and matching network 463. The filter 65 has a pass band including the band D for TDD and is able to pass transmission and reception signals in the band D.

The filter 66 (C-Rx) is coupled between the low-noise amplifier 22 and the antenna connection terminal 100. Specifically, an end of the filter 66 is coupled to the antenna connection terminal 100 via the matching network 461, switch 51, and matching network 401. The other end of the filter 66 is coupled to the input end of the low-noise amplifier 22 via the matching network 462, switch 55, and matching network 463. The filter 66 has a pass band including a downlink operation band of the band C for FDD and is able to pass reception signals in the band C.

The PA controller 71 is able to control the power amplifiers 11 and 12. For example, the PA controller 71 receives digital control signals from the RFIC 3 via the control terminal 131 and outputs control signals to the power amplifiers 11 and 12.

The LNA controller 72 are able to control the low-noise amplifiers 21 and 22. For example, The LNA controller 72 receive digital control signals from the RFIC 3 via the control terminal 132 and output control signals to the low-noise amplifiers 21 and 22.

The bands A to D are frequency bands for communication systems built by using a radio access technology (RAT). The bands A to D are previously defined by a standards body or the like (the 3rd Generation Partnership Project (3GPP) or the Institute of Electrical and Electronics Engineers (IEEE), for example). Examples of the communication systems are a 5th generation new radio (5GNR) system, a long term evolution (LTE) system, and a wireless local area network (WLAN) system.

The bands A and B may be included in a different band group from the bands C and D or may be included in the same band group. Herein, a band group indicates a range of frequencies including plural bands. Band groups can be an ultra-high band group (3300 to 5000 MHz), a high-band group (2300 to 2690 MHz), a mid-band group (1427 to 2200 MHz), and a low-band group (698 to 960 MHz), for example, but are not limited thereto. For example, the band groups may include a band group including an unlicensed band not lower than 5 GHz or a band group in the millimeter wave band.

For example, the bands A and B may be included in the high-band group while the bands C and D are included in the mid-band group. Alternatively, the bands A and B may be included in the mid- or high-band group while the bands C and D are included in the low-band group.

The high-frequency circuit 1 is illustrated by way of example in FIG. 1 and is not limited thereto. For example, the bands covered by the high-frequency circuit 1 are not limited to the bands A to D. For example, the high-frequency circuit 1 may be configured to cover five bands or more. In this case, the high-frequency circuit 1 may include filters for bands E, F, G . . . . Alternatively, for example, the high-frequency circuit 1 may be configured to cover only the bands A and B but not the bands C and D. In this case, the high-frequency circuit 1 does not need to include the power amplifier 12, low-noise amplifier 22, matching networks 441 to 443, 452, and 461 to 463, high-frequency input terminal 112, and high-frequency output terminal 122.

The high-frequency circuit 1 does not need to include all the matching networks 401, 411 to 413, 422, 431 to 433, 441 to 443, 452, and 461 to 463. Furthermore, the high-frequency circuit 1 may be coupled to plural antennas and may include plural antenna connection terminals, for example. The high-frequency circuit 1 may include more high-frequency input terminals. In this case, a switch that is able to switch connections between the power amplifiers and the plural high-frequency input terminals may be provided between the power amplifiers and the plural high-frequency input terminals. The high-frequency circuit 1 may include more high-frequency output terminals. In this case, a switch that is able to switch connections between the low-noise amplifiers and the plural high-frequency output terminals may be provided between the low-noise amplifiers and the plural high-frequency output terminals.

[2 Example of High-frequency Circuit 1]

2.1 Example 1

As Example 1 of the high-frequency circuit 1 according to the embodiment, a high-frequency module 1A, in which the high-frequency circuit 1 is implemented, is described with reference to FIGS. 2 to 5.

[2.1.1 Component Arrangement of High-frequency Module 1A]

Figure 2:
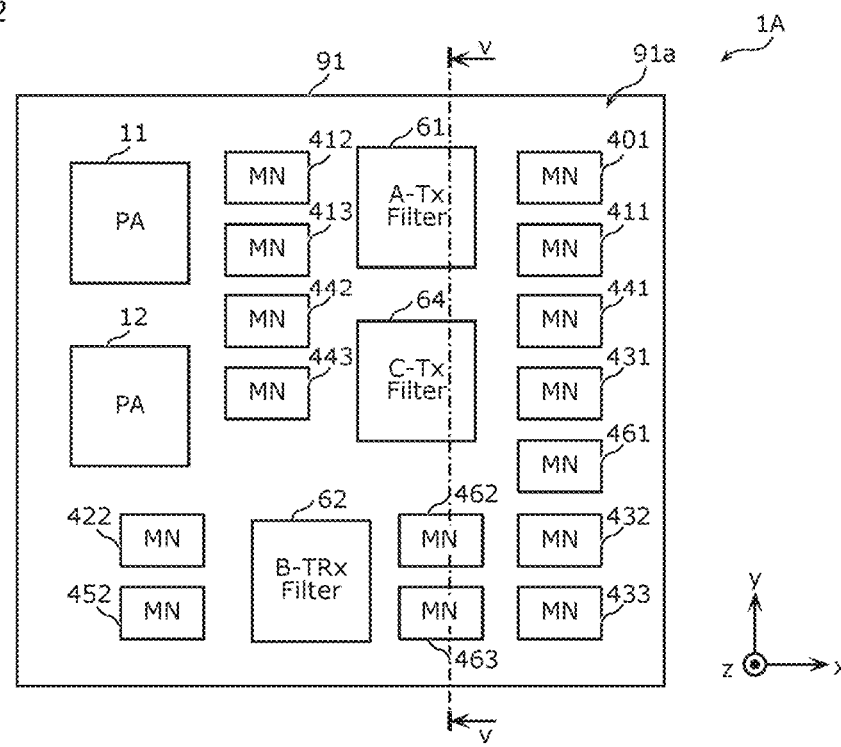
FIG. 2 is a plan view of a first major surface of a high-frequency module according to Example 1.
Figure 3:
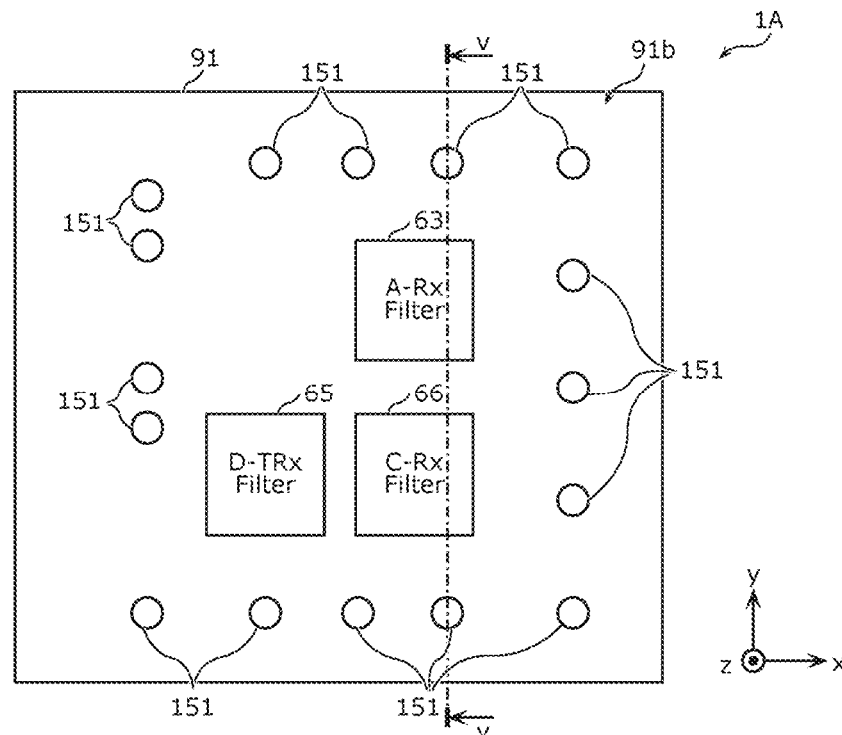
FIG. 3 is a plan view of a second major surface of the high-frequency module according to Example 1.
Figures 4, 5:
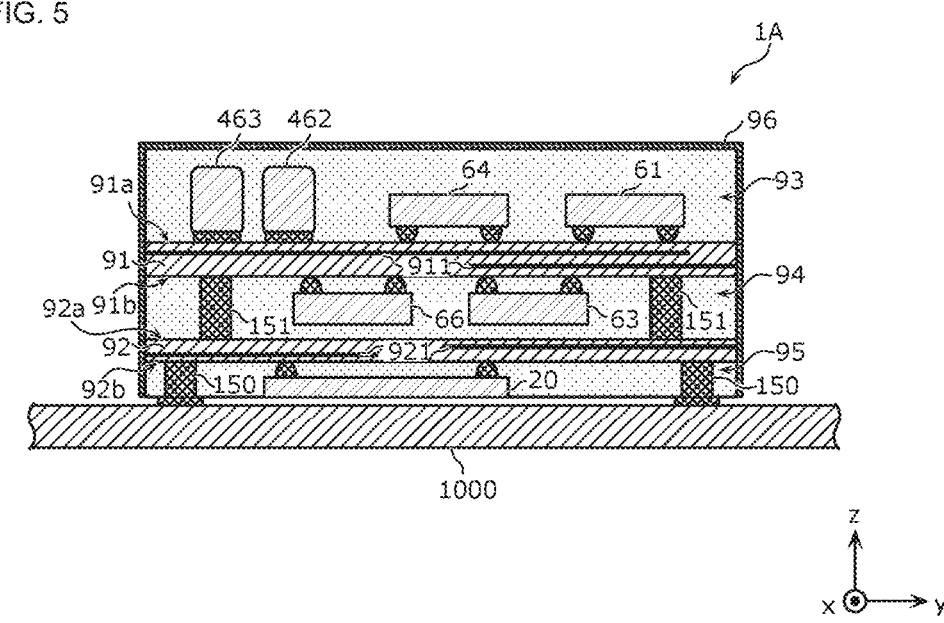
FIG. 4 is a plan view of a fourth major surface of the high-frequency module according to Example 1.
FIG. 5 is a cross-sectional view of the high-frequency module according to Example 1.

FIG. 2 is a plan view of a major surface 91a of the high-frequency module 1A according to Example 1. FIG. 3 is a plan view of a major surface 91b of the high-frequency module 1A according to Example 1. FIG. 3 is a view seen through the major surface 91b side of a module substrate 91 as seen in the positive z-axis direction. FIG. 4 is a plan view of a major surface 92b of the high-frequency module 1A according to Example 1. FIG. 4 is a view seen through the major surface 92b side of a module substrate 92 as seen in the positive z-axis direction. FIG. 5 is a cross-sectional view of the high-frequency module 1A according to Example 1. The cross section of the high-frequency module 1A in FIG. 5 is taken along a line v-v of FIGS. 2 to 4.

FIGS. 2 to 5 do not illustrate traces connecting plural electronic components disposed in the module substrates 91 and 92. FIGS. 2 to 4 do not illustrate resin members 93 to 95 covering plural electronic components and a shield electrode layer 96, which covers the surfaces of the resin members 93 to 95.

In addition to the plural electronic components including the plural circuit elements illustrated in FIG. 1, the high-frequency module 1A includes the module substrates 91 and 92, the resin members 93 to 95, the shield electrode layer 96, plural external connection terminals 150, and plural inter-substrate connection terminals 151.

The module substrate 91 is an example of a first module substrate and includes the major surfaces 91a and 91b, which are opposite to each other. The major surfaces 91a and 91b are examples of first and second major surfaces, respectively. In the module substrate 91, ground electrode patterns 911 are formed. The ground electrode patterns 911 are an example of a first ground electrode pattern. The ground electrode patterns 911 are coupled to ground terminals and are set to the ground potential.

The module substrate 92 is an example of a second module substrate and includes the major surfaces 92a and 92b, which are opposite to each other. The major surfaces 92a and 92b are examples of third and fourth major surfaces, respectively.

Within the module substrate 92, ground electrode patterns 921 are formed. The ground electrode patterns 921 are an example of a second ground electrode pattern. The ground electrode patterns 921 are coupled to ground terminals and are set to the ground potential.

The module substrates 91 and 92 are disposed so that the major surface 91b of the module substrate 91 faces the major surface 92a of the module substrate 92. The module substrates 91 and 92 are disposed at such a distance that the electronic components can be disposed between the major surfaces 91b and 92a. The plural electronic components are disposed in the two module substrates 91 and 92 and, specifically, are separated into three layers: between the major surfaces 91b and 92a; on the major surface 91a; and on the major surface 92b.

In FIGS. 2 to 5, the module substrates 91 and 92 have rectangular shapes of the same size in a planar view. The module substrates 91 and 92 may have different sizes and/or different shapes. The shapes of the module substrates 91 and 92 are not limited to rectangles.

Each of the module substrates 91 and 92 can be, but not limited to, a low temperature co-fired ceramic (LTCC) substrate or a high temperature co-fired ceramic (HTCC) substrate, which includes a laminate structure of plural dielectric layers, an embedded printed circuit board, a substrate including a redistribution layer (RDL), a printed circuit board, or the like, for example.

On the major surface 91a (the upper layer), the power amplifiers 11 and 12, matching networks 401, 411 to 413, 422, 431 to 433, 441 to 443, 452, and 461 to 463, and the filters 61, 62, and 64 are disposed.

The power amplifiers 11 and 12 are composed of complementary metal oxide semiconductors (CMOSs), for example, and specifically, can be manufactured by a silicon-on-insulator (SOI) process. The power amplifiers 11 and 12 can be thereby manufactured at low cost. The power amplifiers 11 and 12 may be composed of at least one of gallium arsenide (GaAs), silicon germanium (SiGe), and gallium nitride (GaN). This can implement the power amplifiers 11 and 12 of high quality. The semiconductor materials of the power amplifiers 11 and 12 are not limited to the aforementioned materials.

Each of the matching networks 401, 411 to 413, 422, 431 to 433, 441 to 443, 452, and 461 to 463 is composed of a chip inductor. The chip inductors are surface mount devices (SMDs) each constituting an inductor. The chip inductors are disposed on the major surface 91a. The chip inductors are not disposed either between the major surfaces 91b and 92a or on the major surface 92b. The chip inductors are thus disposed only in the upper layer of the three layers.

Each matching network may include not only a chip inductor but also a chip capacitor, and the positions of the chip capacitors are not limited. All the matching networks are not necessarily surface-mounted. For example, an inductor and/or a capacitor included in any matching network may be formed within the module substrate 91 and/or 92.

The electronic component including the filter 61 is an example of a first electronic component, and the electronic component including the filter 62 is an example of a fourth electronic component. Each of the electronic components including the respective filters 61, 62, and 64 may be composed of, but not limited to, any one of a surface acoustic wave (SAW) filter, a bulk acoustic wave (BAW) filter, an LC resonance filter, and a dielectric filter, for example. Note that the electronic component including the filter 62 may be disposed between the major surfaces 91b and 92a.

The height of the electronic components including the filters is lower than that of the chip inductors in FIG. 5, but are not limited thereto. For example, the height of the electronic components including the filters may be the same as or higher than that of the chip inductors. In this case, the electronic components including the filters may be in contact with the shield electrode layer 96. This can enhance heat dissipation of the electronic components including the filters, thus improving the temperature characteristics of the filters.

The resin member 93 covers the major surface 91a and the electronic components on the major surface 91a. The resin member 93 has a function of enhancing the reliability, including mechanical strength and moisture resistance, of the electronic components on the major surface 91a. The resin member 93 does not need to be included in the high-frequency module 1A.

Between the major surfaces 91b and 92a (the middle layer), the filters 63, 65, and 66 and the plural inter-substrate connection terminals 151 are disposed. Between the major surfaces 91b and 92a, the resin member 94 is injected and covers the electronic components disposed between the major surfaces 91b and 92a.

The electronic component including the filter 63 is an example of a second electronic component. Between the electronic component (the second electronic component) including the filter 63 and the electronic component (the first electronic component) including the filter 61, the ground electrode patterns 911 are disposed.

Each of the electronic components including the respective filters 63, 65, and 66 may be composed of, but not limited to, any one of a SAW filter, a BAW filter, an LC resonance filter, or a dielectric filter, for example.

The plural electronic components including the respective filters 63, 65, and 66, which are disposed between the major surfaces 91b and 92a, are electrically coupled to the module substrate 91 with electrodes interposed therebetween. The electrodes of each electronic component are provided on the side facing the module substrate 91. The plural electronic components disposed between the major surfaces 91b and 92a may be electrically coupled to the module substrate 92 with electrodes interposed therebetween. The electrodes are provided on the side facing the module substrate 92.

The plural inter-substrate connection terminals 151 are electrodes for electrically coupling the module substrates 91 and 92. Some of the inter-substrate connection terminals 151 overlap the power amplifier 11 or 12 in a planar view and are coupled to the external connection terminals 150 to serve as heat dissipation electrodes of the power amplifiers 11 and 12. The inter-substrate connection terminals 151 are composed of copper post electrodes, for example. The shape and material of the inter-substrate connection terminals 151 are not limited thereto.

The resin member 94 covers the major surfaces 91b and 92a and the electronic components between the major surfaces 91b and 92a. The resin member 94 has a function of enhancing the reliability, including mechanical strength and moisture resistance, of the electronic components between the major surfaces 91b and 92a. The resin member 94 does not need to be included in the high-frequency module 1A.

On the major surface 92b (the lower layer), integrated circuits 20, 50, and 70 and the plural external connection terminals 150 are disposed.

The integrated circuit 20 is an example of a third electronic component and includes the low-noise amplifiers 21 and 22, switches 53 and 55, and the LNA controller 72. The LNA controller 72 is able to control the low-noise amplifiers 21 and 22 upon receiving digital control signals. Between the integrated circuit 20 (the third electronic component) and the electronic component (the second electronic component) including the filter 63, the ground electrode patterns 921 are disposed.

The integrated circuit 50 includes the switch 51. The switch 51 may be included in the integrated circuit 20 or 70.

The integrated circuit 70 includes the switches 52 and 54 and the PA controller 71. The PA controller 71 is able to control the power amplifiers 11 and 12 upon receiving digital control signals.

Each of the integrated circuits 20, 50, and 70 is composed of a CMOS, for example, and specifically, may be manufactured by a SOI process. Each of the integrated circuits 20, 50, and 70 may be composed of at least one of GaAs, SiGe, and GaN. The semiconductor materials of the integrated circuits 20, 50, and 70 are not limited to the aforementioned materials.

The set of electronic circuits included in each of the integrated circuits 20, 50, and 70 is formed on its major surface side that faces the module substrate 92. Each of the integrated circuits 20, 50, and 70 can be cut on the side opposite to the major surface in which the set of electronic circuits is formed.

On the major surface 92b, the integrated circuits 20, and 70, which can be formed by cutting, are disposed while the filters 61 to 66 and matching networks (chip inductors) 401, 411 to 413, 422, 431 to 433, 441 to 443, 452, and 461 to 463 are not disposed. The lower surface of the high-frequency module 1A can be therefore formed by cutting, so that the resin member 95 and the integrated circuits 20, 50, and 70 can be made thinner.

The plural external connection terminals 150 include the antenna connection terminal 100, high-frequency input terminals 111 and 112, high-frequency output terminals 121 and 122, and control terminals 131 and 132, which are illustrated in FIG. 1, and further include ground terminals. The plural external connection terminals 150 are individually joined to input-output terminals, a ground terminal, and/or other terminals on a motherboard 1000, which is laid in the negative z-axis direction with respect to the high-frequency module 1A. The plural external connection terminals 150 can be copper post electrodes, for example. However, the shape and material of the external connection terminals 150 are not limited thereto. Some of the plural external connection terminals 150 overlap the power amplifier 11 or 12 in a planar view and serve as heat dissipation electrodes of the power amplifiers 11 and 12 together with the inter-substrate connection terminals 151 coupled to the power amplifiers 11 and 12.

The resin member 95 covers the major surface 92b and the electronic components on the major surface 92b. The resin member 95 has a function of enhancing the reliability, including mechanical strength and moisture resistance, of the electronic components on the major surface 92b. The resin member 95 does not need to be included in the high-frequency module 1A.

The shield electrode layer 96 is a metallic thin film formed by sputtering, for example. The shield electrode layer 96 is formed so as to cover the upper surface of the resin member 93 and lateral faces of the resin members 93 to and module substrates 91 and 92. The shield electrode layer 96 is coupled to the ground and inhibits external noise from entering the electronic components constituting the high-frequency module 1A. The shield electrode layer 96 does not need to be included in the high-frequency module 1A.

[2.1.2 Effect of High-Frequency Module 1A]

As described above, the high-frequency module 1A according to Example 1 includes: the module substrate 91, which includes the major surfaces 91a and 91b opposite to each other; the module substrate 92, which includes the major surfaces 92a and 92b opposite to each other, the major surface 92a being disposed facing the major surface 91b; the plural electronic components disposed between the major surfaces 91b and 92a, on the major surfaces 91a, and on the major surface 92b; and plural external connection terminals 150, which are disposed on the major surface 92b. The plural electronic components include: the first electronic component including the filter 61, which is coupled to the power amplifier 11; the second electronic component including the filter 63, which is coupled to the low-noise amplifier 21; and the third electronic component (the integrated circuit 20) including the low-noise amplifier 21. The first electronic component is disposed one of between the major surfaces 91b and 92a, on the major surface 91a, and on the major surface 92b. The second electronic component is disposed another one of between the major surfaces 91b and 92a, on the major surface 91a, and on the major surface 92b. The third electronic component is disposed the other one of between the major surfaces 91b and 92a, on the major surface 91a, and on the major surface 92b.

According to such a configuration, the plural electronic components are disposed in three layers, including between the major surfaces 91b and 92a (the middle layer), on the major surface 91a (the upper layer), and on the major surface 92b (the lower layer). This can implement reduction in area of the high-frequency module 1A in a planar view, that is, reduction in size of the high-frequency module 1A. Furthermore, within the three layers, the first electronic component including the filter 61, the second electronic component including the filter 63, and the third electronic component including the low-noise amplifier 21 are disposed in different layers from each other. Specifically, the first electronic component is disposed in any one of the three layers, the second electronic component is disposed in another one of the three layers, and the third electronic component is disposed in the other one of the three layers. This can improve isolation between the first and second electronic components, between the first and third electronic components, and between the second and third electronic components. An improvement in isolation between the first and second electronic components reduces interference between transmission signals passing through the filter 61 and reception signals passing through the filter 63, thus inhibiting reduction in signal quality and receiver sensitivity. An improvement in isolation between the second electronic component and the third electronic component inhibits reception signals from flowing into the low-noise amplifier 21 before passing through the filter 63 due to coupling of the filter 63 and the low-noise amplifier 21, thus inhibiting reduction in receiver sensitivity. An improvement in isolation between the first electronic component and the third electronic component inhibits reduction in signal quality and receiver sensitivity due to coupling of the filter 61 and the low-noise amplifier 21.

In the high-frequency module 1A according to Example 1, for example, the first electronic component may be disposed on the major surface 91a.

This can increase heat dissipation of the first electronic component including the filter 61, which generates more heat than the filter 63 because transmission signals pass through the filter 61, thus improving the temperature characteristics of the filter 61. For example, the first electronic component can be thereby in contact with the shield electrode layer 96, further increasing the heat dissipation.

In the high-frequency module 1A according to Example 1, for example, the second electronic component may be disposed between the major surfaces 91b and 92a.

According to such a configuration, the filter 63 is disposed between the two module substrates 91 and 92. This can inhibit external noise from entering the filter 63.

In the high-frequency module 1A according to Example 1, for example, the third electronic component may be disposed on the major surface 92b.

According to such a configuration, the integrated circuit 20, which includes the low-noise amplifier 21, is disposed in the lower layer. The lower layer can therefore be formed by cutting, so that the high-frequency module 1A can be made thinner.

For example, the high-frequency module 1A according to Example 1 may include the ground electrode patterns 911 within the module substrate 91, and the ground electrode patterns 911 may be disposed between the first and second electronic components.

This can further improve isolation between the first and second electronic components.

For example, the high-frequency module 1A according to Example 1 may include the ground electrode patterns 921 within the module substrate 92, and the ground electrode patterns 921 may be disposed between the second and third electronic components.

This can further improve isolation between the second and third electronic components.

In the high-frequency module 1A according to Example 1, for example, the third electronic component may include the LNA controller 72, which controls the low-noise amplifier 21.

According to such a configuration, the third electronic component including the LNA controller 72 is disposed in a layer different from the first and second electronic components. This can inhibit noise generated in the LNA controller 72 (a digital circuit) from entering the filters 61 and 63.

In the high-frequency module 1A according to Example 1, for example, the filter 61 may have a pass band including the uplink operation band of the band A for FDD, and the filter 63 may have a pass band including the downlink operation band of the band A for FDD.

This can reduce interference between transmission signals and reception signals in the same band, thus inhibiting reduction in signal quality and receiver sensitivity in the FDD.

In the high-frequency module 1A according to Example 1, for example, the plural electronic components may include the fourth electronic component including the filter 62, which is coupled to the power amplifier 11 and the low-noise amplifier 21. The fourth electronic component may be disposed on the major surface 91a.

This can increase heat dissipation of the fourth electronic component including the filter 62, which generates more heat than the filter 63 because transmission signals pass through the filter 62, thus improving the temperature characteristics of the filter 62. For example, the fourth electronic component can thereby be in contact with the shield electrode layer 96, further increasing the heat dissipation.

In the high-frequency module 1A according to Example 1, for example, the third electronic component may include the switch 53, which is coupled between the low-noise amplifier 21 and the filters 62 and 63.

According to such a configuration, the switch 53 can be included in the integrated circuit 20, where the low-noise amplifier 21 is included. This can contribute to reduction in size of the high-frequency module 1A.

2.2 Example 2

Next, a high-frequency module 1B, in which the high-frequency circuit 1 is implemented, is described as Example 2 of the high-frequency circuit 1 according to the embodiment. Example 2 is different from Example 1 described above mostly in being composed of a single module substrate. The following description of the high-frequency module 1B according to Example 2 focuses different points from Example 1 with reference to FIGS. 6 to 9.

[2.2.1 Component Position of High-Frequency Module 1B]

Figures 6, 7:
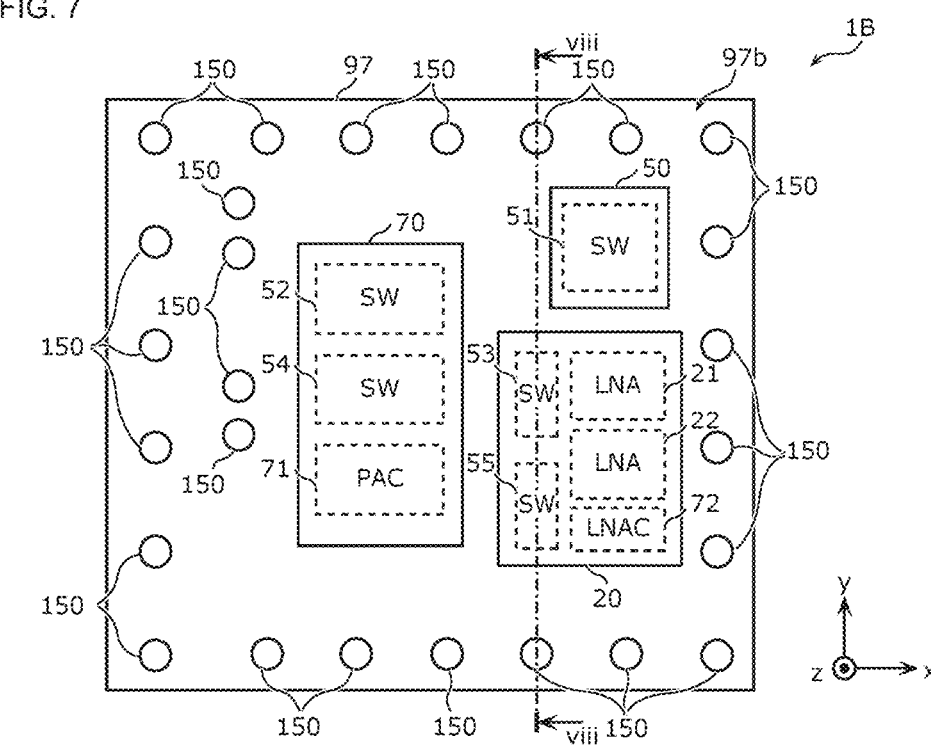
FIG. 6 is a plan view of a first major surface of a high-frequency module according to Example 2.
FIG. 7 is a plan view of a second major surface of the high-frequency module according to Example 2.
Figure 8:
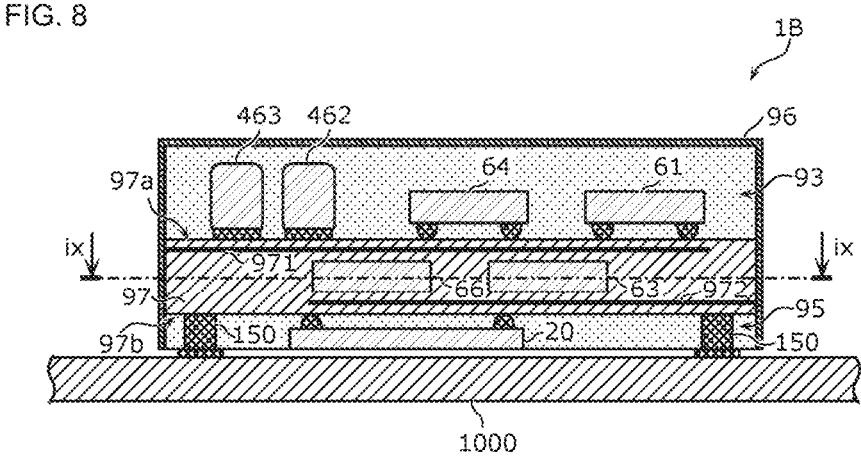
FIG. 8 is a cross-sectional view of the high-frequency module according to Example 2.
Figure 9:
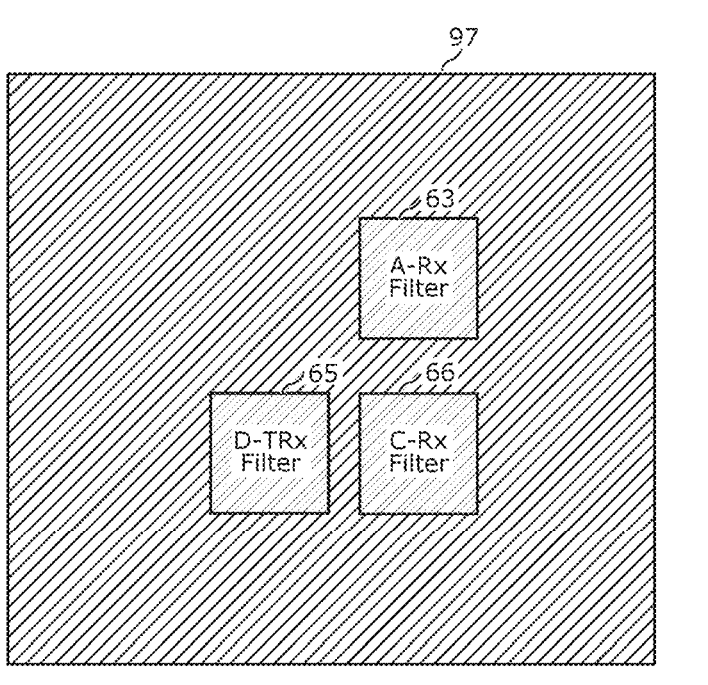
FIG. 9 is another cross-sectional view of the high-frequency module according to Example 2.

FIG. 6 is a plan view of a major surface 97a of the high-frequency module 1B according to Example 2. FIG. 7 is a plan view of a major surface 97b of the high-frequency module 1B according to Example 2. FIG. 7 is a view seen through the major surface 97b side of a module substrate 97 as seen in the positive z-axis direction. FIG. 8 is a cross-sectional view of the high-frequency module 1B according to Example 2. The cross section of the high-frequency module 1B in FIG. 8 is taken along a line viii-viii of FIGS. 6 and 7. FIG. 9 is a cross-sectional view of the high-frequency module 1B according to Example 2. The cross section of the high-frequency module 1B in FIG. 9 is taken along a line ix-ix of FIG. 8.

Similarly to FIGS. 2 and 5, FIGS. 6 to 9 do not illustrate traces connecting plural electronic components disposed in the module substrates 97. FIGS. 6 and 7 do not illustrate the resin members 93 and 95, which cover plural electronic components, and the shield electrode layer 96, which covers the surfaces of the resin members 93 and 95.

In addition to the plural electronic components including the plural circuit elements illustrated in FIG. 1, the high-frequency module 1B includes the module substrate 97, resin members 93 and 95, shield electrode layer 96, and plural external connection terminals 150.

The module substrate 97 includes the major surfaces 97a and 97b, which are opposite to each other. The major surfaces 97a and 97b are examples of the first and second major surfaces, respectively. Within the module substrate 97, ground electrode patterns 971 and 972 are formed. The ground electrode patterns 971 and 972 are examples of the first and second ground electrode patterns, respectively. The ground electrode patterns 971 and 972 are coupled to ground terminals and are set to the ground potential.

The module substrate 97 can be, but not limited to, an LTCC substrate, an HTCC substrate, an embedded printed circuit board, a substrate including an RDL, a printed circuit board, or the like, for example.

On the major surface 97a (the upper layer), similarly to on the major surface 91a of Example 1, the power amplifiers 11 and 12, matching networks 401, 411 to 413, 422, 431 to 433, 441 to 443, 452, and 461 to 463, and the filters 61, 62, and 64 are disposed. In Example 2, the electronic component including the filter 61 is an example of the first electronic component, and the electronic component including the filter 62 is an example of the fourth electronic component. Note that the electronic component including the filter 62 may be disposed in the module substrate 97.

On the major surface 97b (the lower layer), similarly to the major surface 92b of Example 1, the integrated circuits 20, 50, and 70 and the plural external connection terminals 150 are disposed. In Example 2, similarly to Example 1, the integrated circuit 20 is an example of the third electronic component.

Within the module substrate 97 (the middle layer), the filters 63, 65, and 66 are disposed. Specifically, the plural electronic components including the filters 63, 65, and 66 are capsulated within the module substrate 97. In other words, the plural electronic components are embedded between the major surfaces 97a and 97b without being exposed from the major surfaces 97a and 97b. The method of disposing the electronic components within the module substrate 97 is not limited and may use a technique in the related art.

In Example 2, the electronic component including the filter 63 is an example of the second electronic component similarly to Example 1. Between the electronic component (the second electronic component) including the filter 63 and the electronic component (the first electronic component) including the filter 61, the ground electrode pattern 971 is disposed. Between the electronic component (the second electronic component) including the filter 63 and the integrated circuit 20 (the third electronic component), the ground electrode pattern 972 is disposed.

[2.2.2 Effect of High-Frequency Module 1B]

As described above, the high-frequency module 1B according to Example 2 includes: the module substrate 97, which includes the major surfaces 97a and 97b opposite to each other; the plural electronic components disposed on the major surfaces 97a, on the major surface 97b, and within the module substrate 97; and the plural external connection terminals 150, which are disposed on the major surface 97b. The plural electronic components include: the first electronic component including the filter 61, which is coupled to the power amplifier 11; the second electronic component including the filter 63, which is coupled to the low-noise amplifier 21; and the third electronic component (the integrated circuit 20) including the low-noise amplifier 21. The first electronic component is disposed one of on the major surface 97a, on the major surface 97b, and within the module substrate 97. The second electronic component is disposed another one of on the major surface 97a, on the major surface 97b, and within the module substrate 97. The third electronic component is disposed the other one of on the major surface 97a, on the major surface 97b, and within the module substrate 97.

According to such a configuration, the plural electronic components are disposed in the three layers, including the major surface 97a (the upper layer), on the major surface 97b (the lower layer), and within the module substrate 97 (the middle layer). This can implement reduction in area of the high-frequency module 1B in a planar view, that is, reduction in size of the high-frequency module 1B. Furthermore, within the three layers, the first electronic component including the filter 61, the second electronic component including the filter 63, and the third electronic component including the low-noise amplifier 21 are disposed in different layers from each other. Specifically, the first electronic component is disposed in any one of the three layers, the second electronic component is disposed in another one of the three layers, and the third electronic component is disposed in the other one of the three layers. This can improve isolation between the first and second electronic components, between the first and third electronic components, and between the second and third electronic components. An improvement in isolation between the first and second electronic components reduces interference between transmission signals passing through the filter 61 and reception signals passing through the filter 63, thus inhibiting reduction in signal quality and receiver sensitivity. An improvement in isolation between the second electronic component and the third electronic component inhibits reception signals from flowing into the low-noise amplifier 21 before passing through the filter 63 due to coupling of the filter 63 and the low-noise amplifier 21, thus inhibiting reduction in receiver sensitivity. An improvement in isolation between the first electronic component and the third electronic component inhibits reduction in signal quality and receiver sensitivity due to coupling of the filter 61 and the low-noise amplifier 21.

In the high-frequency module 1B according to Example 2, for example, the first electronic component may be disposed on the major surface 97a.

This can increase heat dissipation of the first electronic component including the filter 61, which generates more heat than the filter 63 because transmission signals pass through the filter 61, thus improving the temperature characteristics of the filter 61. For example, the first electronic component can be thereby in contact with the shield electrode layer 96, further increasing the heat dissipation.

In the high-frequency module 1B according to Example 2, for example, the second electronic component may be disposed within the module substrate 97.

According to such a configuration, the filter 63 is disposed within the module substrate 97. This can inhibit external noise from entering the filter 63.

In the high-frequency module 1B according to Example 2, for example, the third electronic component may be disposed on the major surface 97b.

According to such a configuration, the integrated circuit 20, which includes the low-noise amplifier 21, is disposed in the lower layer. The lower layer can therefore be formed by cutting, so that the high-frequency module 1B can be made thinner.

For example, the high-frequency module 1B according to Example 2 may include the ground electrode pattern 971 within the module substrate 97, and the ground electrode pattern 971 may be disposed between the first and second electronic components.

This can further improve isolation between the first and second electronic components.

For example, the high-frequency module 1B according to Example 2 may include the ground electrode pattern 972 within the module substrate 97, and the ground electrode pattern 972 may be disposed between the second and third electronic components.

This can further improve isolation between the second and third electronic components.

In the high-frequency module 1B according to Example 1, for example, the third electronic component may include the LNA controller 72, which controls the low-noise amplifier 21.

According to such a configuration, the third electronic component including the LNA controller 72 is disposed in a layer different from the first and second electronic components. This can inhibit noise generated in the LNA controller 72 (a digital circuit) from entering the filters 61 and 63.

In the high-frequency module 1B according to Example 1, for example, the filter 61 may have a pass band including the uplink operation band of the band A for FDD, and the filter 63 may have a pass band including the downlink operation band of the band A for FDD.

This can reduce interference between transmission signals and reception signals in the same band, thus inhibiting reduction in signal quality and receiver sensitivity in the FDD.

In the high-frequency module 1B according to Example 1, for example, the plural electronic components may include the fourth electronic component including the filter 62, which is coupled to the power amplifier 11 and the low-noise amplifier 21. The fourth electronic component may be disposed on the major surface 97a.

This can increase heat dissipation of the fourth electronic component including the filter 62, which generates more heat than the filter 63 because transmission signals pass through the filter 62, thus improving the temperature characteristics of the filter 62. For example, the fourth electronic component can thereby be in contact with the shield electrode layer 96, further increasing the heat dissipation.

In the high-frequency module 1B according to Example 1, for example, the third electronic component may include the switch 53, which is coupled between the low-noise amplifier 21 and the filters 62 and 63.

According to such a configuration, the switch 53 can be included in the integrated circuit 20, where the low-noise amplifier 21 is included. This can contribute to reduction in size of the high-frequency module 1A.

(Modification)

The high-frequency module and communication device according to the present disclosure are described based on the embodiment and examples hereinabove but are not limited to the aforementioned embodiment and examples. The present disclosure includes another example implemented by a combination of any constituent elements of the aforementioned examples, modifications obtained by performing for the aforementioned embodiment and examples, various changes that can be conceived by those skilled in the art without departing from the spirit of the present disclosure, and various devices incorporating the aforementioned high-frequency module.

In the circuit configurations of the high-frequency circuit and communication device according to the aforementioned embodiments, for example, other circuit elements, traces, and the like may be inserted in paths connecting circuit elements and signal paths disclosed in the drawings. For example, a matching network may be inserted between the switch 51 and the filter 62 and/or between the switch 51 and the filter 65.

The positions of the plural electronic components are illustrated in the aforementioned examples by way of example and are not limited to the aforementioned examples. For example, the position of any electronic component in any of the aforementioned examples may be substituted with the position of the same electronic component in the other example. Furthermore, in each example, the integrated circuit 70 including the PA controller 71 may be laid on top of the power amplifiers 11 and/or 12, for example.

In each of the aforementioned examples, the electronic component (the first electronic component) including the filter 61, the electronic component (the second electronic component) including the filter 63, and the integrated circuit 20 (the third electronic component) including the low-noise amplifier 21 are disposed in the upper, middle, and lower layers, respectively, but are not limited to these positions. The first electronic component may be also disposed in the middle or lower layer, the second electronic component may be also disposed in upper or lower layer, or the third electronic component may be also disposed in the upper or middle layer. In this case, any pair of the first, second, and third electronic components need to be not disposed in the same layer. Specifically, the first electronic component needs to be disposed in any one of the three layers, the second electronic component needs to be disposed in another one of the three layers, and the third electronic component needs to be disposed in the other one of the three layers.

The external connection terminals 150 are composed of copper post electrodes in the aforementioned examples but are not limited thereto. For example, the external connection terminals 150 may be bump electrodes. In this case, the high-frequency module does not need to include the resin member 95.

INDUSTRIAL APPLICABILITY

The present disclosure can be widely used in communication devices, including mobile phones, as a high-frequency module provided in the front end.

The invention claimed is:

1. A high-frequency module, comprising:

a first module substrate including a first major surface and a second major surface that are opposite to each other;

a second module substrate including a third major surface and a fourth major surface that are opposite to each other, the third major surface being disposed facing the second major surface;

a plurality of electronic circuitry disposed between the second major surface and the third major surface, on the first major surface, and on the fourth major surface; and a plurality of external connection terminals disposed on the fourth major surface, wherein the plurality of electronic components include:

a first electronic circuitry including a first filter coupled to a power amplifier;

a second electronic circuitry including a second filter coupled to a low-noise amplifier, and a third electronic circuitry including the low-noise amplifier, the first electronic circuitry is disposed one of between the second major surface and the third major surface, on the first major surface, or on the fourth major surface, the second electronic circuitry is disposed one of between the second major surface and the third major surface, on the first major surface, or on the fourth major surface, and the third electronic circuitry is disposed one of between the second major surface and the third major surface, on the first major surface, or on the fourth major surface.

2. The high-frequency module according to claim 1, wherein
the first electronic circuitry is disposed on the first major surface.

3. The high-frequency module according to claim 1, wherein
the second electronic circuitry is disposed between the second major surface and the third major surface.

4. The high-frequency module according to claim 1, wherein
the third electronic circuitry is disposed on the fourth major surface.

5. The high-frequency module according to claim 1, further comprising:
a first ground electrode pattern within the first module substrate, wherein
the first ground electrode pattern is disposed between the first electronic circuitry and the second electronic circuitry.

6. The high-frequency module according to claim 1, further comprising:
a second ground electrode pattern within the second module substrate, wherein
the second ground electrode pattern is disposed between the second electronic circuitry and the third electronic circuitry.

7. The high-frequency module according to claim 1, wherein
the third electronic circuitry includes a low-noise amplifier (LNA) controller controlling the low-noise amplifier.

8. The high-frequency module according to claim 1, wherein
the first filter has a pass band including an uplink operation band of a frequency division duplex (FDD) band, and
the second filter has a pass band including a downlink operation band of the FDD band.

9. The high-frequency module according to claim 1, wherein
the plurality of electronic components include a fourth electronic circuitry including a third filter coupled to the power amplifier and the low-noise amplifier, and
the fourth electronic circuitry is disposed on the first major surface.

10. The high-frequency module according to claim 9, wherein
the third electronic circuitry includes a switch coupled between the second filter and the low-noise amplifier and between the third filter and the low-noise amplifier.

11. A high-frequency module, comprising:
a module substrate including a first major surface and a second major surface that are opposite to each other;
a plurality of electronic circuitry disposed on the first major surface, on the second major surface, and within the module substrate; and
a plurality of external connection terminals disposed on the second major surface, wherein the plurality of electronic circuitry include:
a first electronic circuitry including a first filter coupled to a power amplifier;
a second electronic circuitry including a second filter coupled to a low-noise amplifier; and
a third electronic circuitry including the low-noise amplifier,
the first electronic circuitry is disposed one of on the first major surface, on the second major surface, or within the module substrate,
the second electronic circuitry is disposed one of on the first major surface, on the second major surface, and within the module substrate, and
the third electronic circuitry is disposed one of on the first major surface, on the second major surface, and within the module substrate,
wherein the third electronic circuitry includes a low-noise amplifier (LNA) controller controlling the low-noise amplifier.

12. The high-frequency module according to claim 11, wherein
the first electronic circuitry is disposed on the first major surface.

13. The high-frequency module according to claim 11, wherein
the second electronic circuitry is disposed within the module substrate.

14. The high-frequency module according to claim 11, wherein
the third electronic circuitry is disposed on the second major surface.

15. The high-frequency module according to claim 11, further comprising:
a first ground electrode pattern within the module substrate, wherein
the first ground electrode pattern is disposed between the first electronic circuitry and the second electronic circuitry.

16. The high-frequency module according to claim 11, further comprising:
a second ground electrode pattern within the module substrate, wherein
the second ground electrode pattern is disposed between the second electronic circuitry and the third electronic circuitry.

17. The high-frequency module according to claim 11, wherein
the first filter has a pass band including an uplink operation band of a frequency division duplex (FDD) band, and
the second filter has a pass band including a downlink operation band of the FDD band.

18. The high-frequency module according to claim 11, wherein
the plurality of electronic circuitry include a fourth electronic circuitry including a third filter coupled to the power amplifier and the low-noise amplifier, and
the fourth electronic circuitry is disposed on the first major surface.

19. The high-frequency module according to claim 18, wherein
the third electronic circuitry includes a switch coupled between the second filter and the low-noise amplifier and between the third filter and the low-noise amplifier.

* * * * *